April 1, 1969 A. F. CARINI ET AL 3,435,801

SOLDER DEPOSIT AND LEVELING MACHINES

Filed March 2, 1967

INVENTORS.
ALEXANDER F. CARINI,
HOWARD W. WEGENER &
KENNETH G. BOYNTON

BY A. J. Feinberg

ATTORNEY.

United States Patent Office
3,435,801
Patented Apr. 1, 1969

3,435,801
SOLDER DEPOSIT AND LEVELING MACHINES
Alexander F. Carini, 5 Farley St., Milford, N.H. 03055; Howard W. Wegener, Abbott Hill, Wilton, N.H. 03086; and Kenneth G. Boynton, Milford, N.H. 03055
Filed Mar. 2, 1967, Ser. No. 620,184
Int. Cl. B05c *5/00;* H05k *3/00*
U.S. Cl. 118—63 9 Claims

ABSTRACT OF THE DISCLOSURE

An automatic mass solder depositing and leveling machine with successive operations of foam fluxing, fountain application of solder and blast-off removal of excess solder, all applied horizontally to a copper printed circuit board, coating the board with a copper-tin interface on the printed portions for final subsequent soldering operations.

This invention relates to printed circuit boards and particularly to a machine for initially preparing such boards for subsequent positive soldering operations.

In the most common types of present machines performing this function, in order to prevent oxidation, etched copper circuit boards are coated on the printed portions by various methods that require the boards to be dipped into molten solder causing delamination, lack of thickness control and uneven coating. A preliminary precious metal plating was also sometimes resorted to, in order to prevent such oxidation but which still did not result in the high resolution printed circuit boards now required by manufacturers when the final soldering is applied to the boards. A preliminary tinning operation appeared to be necessary to protect the original copper from oxidation and other forms of deterioration.

Various machines perform some of the conventional steps of soldering a printed circuit board while it is in a vertical position. There are disadvantages to such an operation due to uneven drainage and excess accumulation of solder on the lower portions of the board.

A primary object of this invention is to provide a solder deposit and leveling machine that is capable of removing excess solder and coating copper printed circuit boards with a copper-tin interface for the final subsequent soldering operation so that they will meet the severest specifications.

Among the further objects and advantages of this invention may be mentioned:

To provide printed circuit board having an extra thin uniform coating of solder deposited on the copper printed portion for the final soldering operation, To provide a printed circuit board that affords protection against oxidation before final soldering, To prepare printed circuit boards for future permanent soldering by any method, which boards can be evenly stacked, drilled and stored without warping or deterioration.

In accordance with our invention, there is produced a solder and leveling machine which is efficient and reliable. It processes boards of various lengths and widths in a horizontal position at a rate of speed resulting in lower costs and a more permanent product. It allows final permanent soldering at lower temperatures through improved wearability provided by the resulting alloyed copper and tin printed surfaces, thus producing stronger joints and a minimum of damage to the heat sensitive components often used in the final assembly.

Figure 1:
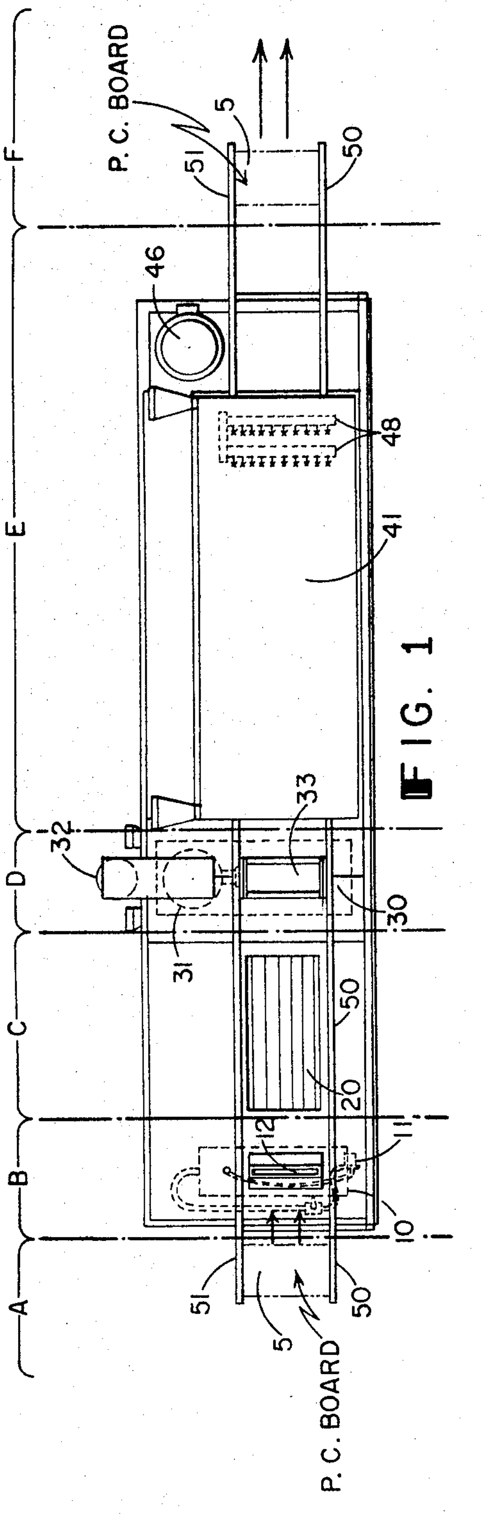
Figure 2:
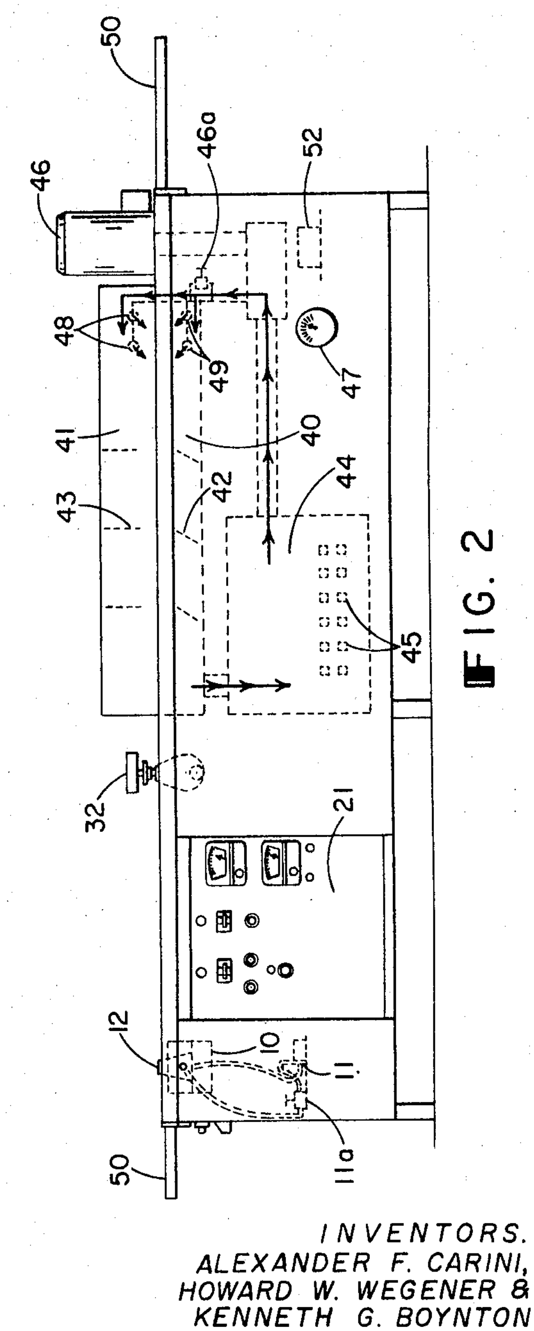

The features of novelty which are believed to be characteristic of this invention will hereinafter appear from the following description and specification of a preferred embodiment as shown in the accompanying drawings in which:

FIG. 1 is a diagrammatic layout of the machine showing the salient functions of each of the required portions according to this invention, FIG. 2 is a front view of FIG. 1.

Our invention consists of a solder and leveling machine having a combination of six contiguous portions operating in dependent sequence to produce the required novel result. These comprise a loading portion A, a fluxing portion B, a preheating portion C, a soldering station D, a leveling chamber E, and an unloading portion F, each of which portions cooperate with adjoining portions and are transversed by a continuously operating transporting assembly T.

The horizontal transporting assembly T consists of a pair of parallel trackways and provides means to convey horizontally a printed circuit board between the trackways provided with endless chains equipped with pushers from the loading portion A to the unloading portion F moving the board successively into and through the fluxing portion B, the preheating portion C, the soldering station D and the leveling chamber E.

The fluxing portion B, positioned below the parallel trackways, provides means to circulate flux in a flux tank in order to maintain an even mixture. Air is bibbled through the flux to produce a mound of foaming flux exuding from a horizontal flux orifice.

Contiguous to the fluxing portion B is the preheating portion C also positioned below the parallel trackways, consisting of commercial heating elements which are controlled from an exterior heat control panel by conventional means.

Contiguous to the preheating means provided in portion C is the soldering station D, also positioned below the parallel trackways, providing soldering means which consist of a circulatory system for pumping liquid solder from a heated sump containing solder, or solder and oil, upwardly in a vertical wave with a horizontal crest, which after contact with the board, allows the solder to spill over the sides of the soldering orifice and back into the sump.

Contiguous to the soldering portion D are the blast-off means in the leveling chamber E consisting of a circulatory system of nontoxic, fire resistant slow degrading, unctuous, blast-off liquid applied under controlled temperature of from 350 to 450 degrees Fahrenheit and pressure ranging from 10 to 50 pounds per square inch. This liquid contains viscous compounds of triaryl phosphates or akyl phosphate esters having a molecular weight range of 350–450 and is pumped from a heated fluid reservoir and discharged from a series of opposing nozzles positioned horizontally above and below the parallel trackways, contacting the upper and power surfaces of the board, as it passes horizontally between the upper and lower nozzles, at angles of from 15 to 60 degrees depending on the pressure applied. Each of the nozzles discharges a flat, sharply defined spray pattern with uniform distribution, minimum atomization and maximum impact. After contact the liquid drains back into the fluid reservoir for reuse.

Referring to the drawings, the machine therein shown, as illustrative of one embodiment of our invention comprises a flux tank 10 holding liquid flux through which air is bubbled forming a mound of foaming flux which is pumped by flux pump 11, through bypass valve 11A and upwardly through the flux orifice 12. The preheating elements 20 are regulated from the heater control panel 21. The solder sump 30 is filled with solder which may have a layer of oil floating on top of the solder. The solder, or solder and oil, is pumped upwardly by solder pump 31, actuated by motor 32 and is discharged from the solder orifice 33. In the leveling chamber there is located a spray tank 40 with tank cover 41 having baffles 42 in the tank and baffles 43 in the cover, to reduce the splashing resulting from the strong impact of the blast-off fluid on the board and to localize the excess solder removed from the board.

A fluid reservoir 44, positioned below the tank 40, is provided with heater elements 45. The blast-off fluid is pumped by pump 46 through a bypass valve 46A with associated pressure gauge 47 recording the pressure which is regulated by opening or closing the bypass valve, through the opposing upper spray nozzles 48 and the lower spray nozzles 49.

The horizontal trackways 50 and 51 extend over the loading portion, are positioned over the flux orifice 12, the preheater 20, the solder orifice 33 and the fluid reservoir 44. They pass into the spray tank 40 and between the upper and lower spray nozzles 48 and 49, and protrude into the unloading portion. The portion of the trackways 50 and 51 which extend into the leveling chamber, together with the fluid reservoir 44, and the nozzles 48 and 49, are covered by the spray tank cover 41. The horizontal distance between the trackways 50 and 51 may be varied by conventional means, not shown. The trackways are provided with grooves adapted to hold the circuit boards which travel along the trackways propelled by conventional endless chains and pusher means, not shown.

In operation, a circuit board 5, printed in copper, is placed between the trackways 50 and 51, provided with endless chains and pushers which carry it into and through the horizontal mound of foaming flux being discharged from the horizontal flux orifice 12, thence, while wet, over the preheating elements 20 which prepares the board for solder. It then passes, while hot, into and through the horizontal crest of the vertical wave of circulating solder, or solder and oil, being discharged from the horizontal solder orifice, where solder, oftentimes in excess, is deposited on the prepared copper circuitry of the board. The board, freshly soldered, then passes into the spray tank 40 which is of sufficient length to permit the liquid solder on the board to solidify before the board passes between the opposing nozzles 48 and 49 which are sufficiently spaced from the soldering orifice to allow this solidification. The impact of the blast-off liquid issuing from these nozzles removes the excess solder leaving only the desired thin uniform layer of copper-tin on the circuitry on the face of the board. The board then passes into the unloading portion where it is automatically discharged.

While the preferred embodiment of our invention has been described in detail it will be understood that we do not wish to be limited to the particular construction set forth, since various changes in the form, materials and proportions of the parts and in the detail of construction, shown and not shown, may be resorted to without departure from the spirit and scope of the invention or destroying any of the advantages contained in the same, heretofore described and defined in the following claims.

We claim:

1. A solder deposit and leveling machine for removing excess solder and for pretinning printed circuit boards devoid of all electric circuit components, comprising, in combination, means for producing a vertical continuous mound of foaming flux with a horizontal crest and inserting said board into said crest, means for preheating said board prior to the application of solder, means for producing a vertical continuous wave of solder with a horizontal crest and inserting the bottom of said board into said crest, means for leveling off and removing excess solder by a blast-off liquid leaving a copper tinned circuit surface, said solder having been previously deposited by said soldering means, and means for carrying said board in a horizontal position in succession to and through said fluxing, preheating, soldering and leveling means.

2. A solder deposit and leveling machine in accordance with claim 1, wherein said blast-off liquid comprises a fire resistant, nontoxic, slow degrading, unctuous liquid, applied under controlled temperature and pressure.

3. A solder deposit and leveling machine in accordance with claim 1, wherein said blast-off liquid comprises a fire resistant, slow degrading, unctuous liquid, applied under controlled temperature and pressure, said temperature being in the range of 350 to 450 degrees Fahrenheit and said pressure being in the range of 10 to 50 pounds per square inch.

4. A solder deposit and leveling machine in accordance with claim 1, wherein said blast-off liquid contains viscous compounds of triaryl phosphates having a molecular weight range of 350 to 450.

5. A solder deposit and leveling machine in accordance with claim 1, wherein said blast-off liquid contains alkyl phosphate esters.

6. A solder deposit and leveling machine in accordance with claim 1, wherein said blast-off liquid is applied by sprays from upper and lower opposing nozzles positioned horizontally, said board passing horizontally between said nozzles, said spray contacting said board at angles of 15 to 60 degrees to said boards, said angles varying according to the pressure applied.

7. A solder deposit and leveling machine in accordance with claim 1, wherein said blast-off liquid is applied by sprays from upper and lower opposing nozzles, said sprays contacting said board at angles of from 15 to 60 degrees to said horizontal boards, said nozzles discharging a flat, sharply defined spray pattern, with uniform distribution, minimum atomization, and maximum impact.

8. A solder deposit and leveling machine for removing excess solder and for pretinning a printed circuit board devoid of all electric circuit components comprising, in combination, means for inserting the horizontal surfaces of said board into the horizontal crest of a vertical mound of foaming flux, means for preheating said board after the application of said flux and prior to the application of solder, means for inserting the horizontal lower surface of said board into the horizontal crest of a vertical wave of circulating solder, means for applying a continuous blast of circulating, fire resistant, blast-off liquid, under controlled temperature and pressure, to the upper and lower surfaces of said board, leaving a copper tinned circuit surface and means for transporting said circuit boards in a horizontal position successively to and through said fluxing, preheating, soldering, and blast-off means.

9. The combination claimed in claim 8 in which said transporting means carries said boards first through the crest of said wave of solder and then between the sprays from said upper and lower opposing spray nozzles, said sprays being spaced horizontally from said wave, so that the solder applied by said wave is solidified before said board reaches said spray from said nozzles.

References Cited

UNITED STATES PATENTS

| | | | |
|---|---|---|---|
| 2,386,156 | 10/1945 | Woodward | 118—63 |
| 2,889,803 | 6/1959 | Pearson | 118—63 |
| 3,190,527 | 6/1965 | Tardoskegyi | 228—37 |
| 3,218,193 | 11/1965 | Isaacson | 228—37 |
| 3,151,592 | 10/1964 | Wegener | 228—37 |
| 3,135,630 | 6/1964 | Bielinski | 228—37 |
| 3,303,983 | 2/1967 | Patrick | 228—37 |
| 3,277,566 | 10/1966 | Christensen | 228—37 |
| 3,198,414 | 8/1965 | Tardoskegyi | 228—37 |
| 3,216,643 | 11/1965 | Verter | 228—37 |
| 3,081,535 | 3/1963 | Lincoln. | |

RICHARD H. EANES, Jr., *Primary Examiner.*